US010276370B2

(12) United States Patent
Filler et al.

(10) Patent No.: US 10,276,370 B2
(45) Date of Patent: Apr. 30, 2019

(54) METHODS FOR THE CONTINUOUS, LARGE-SCALE MANUFACTURE OF FUNCTIONAL NANOSTRUCTURES

(71) Applicant: Georgia Tech Research Corporation, Atlanta, GA (US)

(72) Inventors: Michael A. Filler, Atlanta, GA (US); Sven Holger Behrens, Atlanta, GA (US); Laurens Victor Breedveld, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 15/540,622

(22) PCT Filed: Dec. 29, 2015

(86) PCT No.: PCT/US2015/067832
§ 371 (c)(1),
(2) Date: Jun. 29, 2017

(87) PCT Pub. No.: WO2016/109516
PCT Pub. Date: Jul. 7, 2016

(65) Prior Publication Data
US 2017/0372898 A1 Dec. 28, 2017

Related U.S. Application Data

(60) Provisional application No. 62/097,172, filed on Dec. 29, 2014.

(51) Int. Cl.
| H01L 21/02 | (2006.01) |
| C23C 16/04 | (2006.01) |
| C23C 16/44 | (2006.01) |
| C23C 16/442 | (2006.01) |

(52) U.S. Cl.
CPC ...... *H01L 21/02653* (2013.01); *C23C 16/045* (2013.01); *C23C 16/442* (2013.01);
(Continued)

(58) Field of Classification Search
CPC ...... B22F 1/0018; B22F 1/0051; B22F 1/025; B22F 2001/0029; H01L 21/02603; H01L 21/02606
See application file for complete search history.

(56) References Cited

U.S. PATENT DOCUMENTS 8,075,664 B1 * 12/2011 Wang ............ B01J 13/02
75/252
2004/0058224 A1 * 3/2004 Eshraghi ......... H01M 4/8605
429/465

(Continued)

FOREIGN PATENT DOCUMENTS

| CN | 1025535578 | 7/2012 |
| WO | 2013114218 | 8/2013 |

OTHER PUBLICATIONS

Search Report and Written Opinion from related PCT Application No. PCT/US2015/067832 dated Mar. 21, 2016 (8 pages).
(Continued)

*Primary Examiner* — Jaehwan Oh
(74) *Attorney, Agent, or Firm* — Troutman Sanders LLP; Ryan A. Schneider (57) ABSTRACT

A method for forming nanostructures including introducing a hollow shell into a reactor. The hollow shell has catalyst nanoparticles exposed on its interior surface. The method also includes introducing a precursor into the reactor to grow nanostructures from the interior surface of the hollow shell from the catalyst nanoparticles.

40 Claims, 8 Drawing Sheets

(52) U.S. Cl.
CPC ...... *C23C 16/4417* (2013.01); *H01L 21/0262* (2013.01); *H01L 21/02532* (2013.01); *H01L 21/02576* (2013.01); *H01L 21/02579* (2013.01); *H01L 21/02603* (2013.01); *H01L 21/02606* (2013.01); *H01L 21/02645* (2013.01); *H01L 21/02543* (2013.01); *H01L 21/02546* (2013.01)

(56) References Cited

U.S. PATENT DOCUMENTS

| | | | |
|---|---|---|---|
| 2009/0012754 A1 | 5/2009 | Taylor | |
| 2011/0045660 A1* | 2/2011 | Romano | B82Y 10/00 438/478 |
| 2011/0070488 A1* | 3/2011 | West | H01M 4/04 429/209 |
| 2012/0051997 A1* | 3/2012 | Wicks | B82Y 30/00 423/448 |
| 2015/0033937 A1* | 2/2015 | Lashmore | C01B 21/0641 89/36.02 |

OTHER PUBLICATIONS

Weizhong, et al., "Production of Carbon Nanotubes in a Packed Bed and a Fluidized Bed," AIChE Journal, vol. 49, No. 3 Mar. 2003 pp. 619-625.

Hu, et al., "One-Step Synthesis of Silica Hollow Particles in a W/O Inverse Emulsion," Colloid and Polymer Science, vol. 291, No. 11 Nov. 2013.

* cited by examiner

METHODS FOR THE CONTINUOUS, LARGE-SCALE MANUFACTURE OF FUNCTIONAL NANOSTRUCTURES

CROSS REFERENCE TO RELATED APPLICATIONS

This application is a U.S. National Stage Application of, and claims benefit of priority pursuant to 35 U.S.C. § 371 Of International Patent Application PCT/US2015/067832 filed on Dec. 29, 2015, which claims the benefit of U.S. Provisional Patent Application Ser. No. 62/097,172, filed Dec. 29, 2014, each of which is hereby incorporated by reference in its entirety.

STATEMENT REGARDING FEDERALLY SPONSORED RESEARCH

This invention was made with govenment support under Contract Numbers CMMI-1150755 and CBET-1133563, awarded by National Science Foundation. The Government has certain rights in the invention.

TECHNICAL FIELD DISCLOSED

Embodiments of the disclosed technology generally relate to nanostructure manufacture. More particularly, the disclosed technology relates to growing nanostructures based on bottom-up synthesis on the interior of a hollow shell.

BACKGROUND DISCLOSED

Nanostructures are building blocks for next generation materials or devices. A nanostructure may exhibit any configuration, including, but not limited to, a rod-like structure such as a nanowire or a tube-like structure such as a nanotube, among many other possibilities. Nanostructures offer a vast array of unique and technologically useful properties, which depend on their atomic- and nanometer-scale structure (e.g., diameter, length, morphology, crystal structure, composition, and heterostructure). Bottom-up growth permits many structures that are inaccessible in the bulk or thin films.

Existing methods for producing high quality nanostructures have many flaws. By way of example, known bottom-up vapor-liquid-solid (VLS) synthesis, while currently offering the best control of semiconductor nanowire structure, occurs on flat substrates. Such 2-D processes (i.e., with areal scaling) cannot achieve high productivities and, therefore, cannot offer economically competitive scale-up. 3-D processes (i.e., with volumetric scaling) would be ideal for applications requiring large quantities of materials such as thermoelectrics, photovoltaics and large-area electronics. However, the known candidates, including solution-liquid-solid (SLS) synthesis or aerotaxy, suffer from uncontrolled agglomeration and/or inadequate control of nanowire structure.

International Publication No. WO/2013114218 entitled "High-throughput continuous gas-phase synthesis of nanowires with tunable properties" pertains to "seed particles suspended in a gas" as claimed. The process disclosed therein is fundamentally limited in terms of productivity and structural control. As disclosed therein, nanowires that are simply entrained in the bulk gas flow during growth. As such, nanowires can freely interact with each other, particularly as their volumetric density increases, resulting in a number of undesirable outcomes. For example, Van der Waals forces would drive nanowires to irreversibly agglomerate and ultimately precipitate. This behavior reduces the maximum allowable nanowire density inside the reactor and consequently reduces reactor productivity. Further, liquid catalyst nanoparticles would likely deform upon nanowire-nanowire collision. Catalyst nanoparticle perturbations can result in undesirable nanowire structures (e.g., kinks) and even the termination of growth. Still further, nanowire-nanowire collisions may induce structural damage (e.g., breaking).

Chinese Patent No. 102553557B, entitled "Preparation method of hollow glass microsphere with directionally grown titania nanotubes on surface," discloses a method to prepare a hollow glass microsphere with directionally grown titania nanotubes on the surface. Its method includes coating a layer of $TiO_2$ film on the surface of the hollow glass microsphere by a surface sol-gel process. To obtain the hollow glass microsphere with the directionally grown quantum dot modified titanium dioxide nanotubes on its surface, processes involving calcination, hydrothermal and nano-composite material synthesis are performed. The prepared hollow glass microsphere with the directionally grown quantum dot modified titanium dioxide nanotubes are used as a photocatalyst in treating offshore petroleum contaminants.

Existing methods for nanostructure production cannot simultaneously meet productivity, yield and functional requirements of many applications. For example, thermoelectric technologies demand Si nanowires in kilogram quantities with dopant concentrations of $\sim10^{20}$ cm$^{-3}$.

Based on the foregoing, there is a need for a cost-effective, versatile and reliable solution to produce nanostructures on a large scale, where individual nanostructures are configurable to a fine degree, for example, in terms of diameter, length, morphology, crystal structure, composition, and heterostructure.

BRIEF SUMMARY DISCLOSED

One aspect of the disclosed technology relates a method for forming nanostructures. The method includes introducing a hollow shell into a reactor. The hollow shell has catalyst nanoparticles exposed on its interior surface. The method also includes introducing a precursor into the reactor to grow nanostructures from an interior surface of the hollow shell from the catalyst nanoparticles.

These and other aspects of the disclosed technology are described in the Detailed Description disclosed below and the accompanying figures. Other aspects and features of embodiments of the disclosed technology will become apparent to those of ordinary skill in the art upon reviewing the following description of specific, exemplary embodiments of the disclosed technology in concert with the figures. While features of the disclosed technology may be discussed relative to certain embodiments and figures, all embodiments of the disclosed technology can include one or more of the features discussed herein. While one or more embodiments may be discussed as having certain advantageous features, one or more of such features may also be used with the various embodiments of the disclosed technology discussed herein. In a similar fashion, while exemplary embodiments may be discussed below as system or method embodiments, it is to be understood that such exemplary embodiments may be implemented in various devices, systems, and methods of the disclosed technology.

BRIEF DESCRIPTION OF THE DRAWINGS

The following Detailed Description technology is better understood when read in conjunction with the appended drawings. For the purposes of illustration, there is shown in the drawings exemplary embodiments, but the subject matter is not limited to the specific elements and instrumentalities disclosed.

DETAILED DESCRIPTION

To facilitate an understanding of the principles and features of the various embodiments of the present invention, various illustrative embodiments are explained below. Although exemplary embodiments of the present invention are explained in detail, it is to be understood that other embodiments are contemplated. Accordingly, it is not intended that the present invention is limited in its scope to the details of construction and arrangement of components set forth in the following description or examples. The present invention is capable of other embodiments and of being practiced or carried out in various ways. Also, in describing the exemplary embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents that operate in a similar manner to accomplish a similar purpose.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified. Such other components or steps not described herein can include, but are not limited to, for example, similar components or steps that are developed after development of the disclosed technology.

The materials described as making up the various elements of the present invention are intended to be illustrative and not restrictive. Many suitable materials that would perform the same or a similar function as the materials described herein are intended to be embraced within the scope of the present invention. Such other materials not described herein can include, but are not limited to, for example, materials that are developed after the time of the development of the present invention.

1. Nanostructure Manufacture Method

Figure 1:
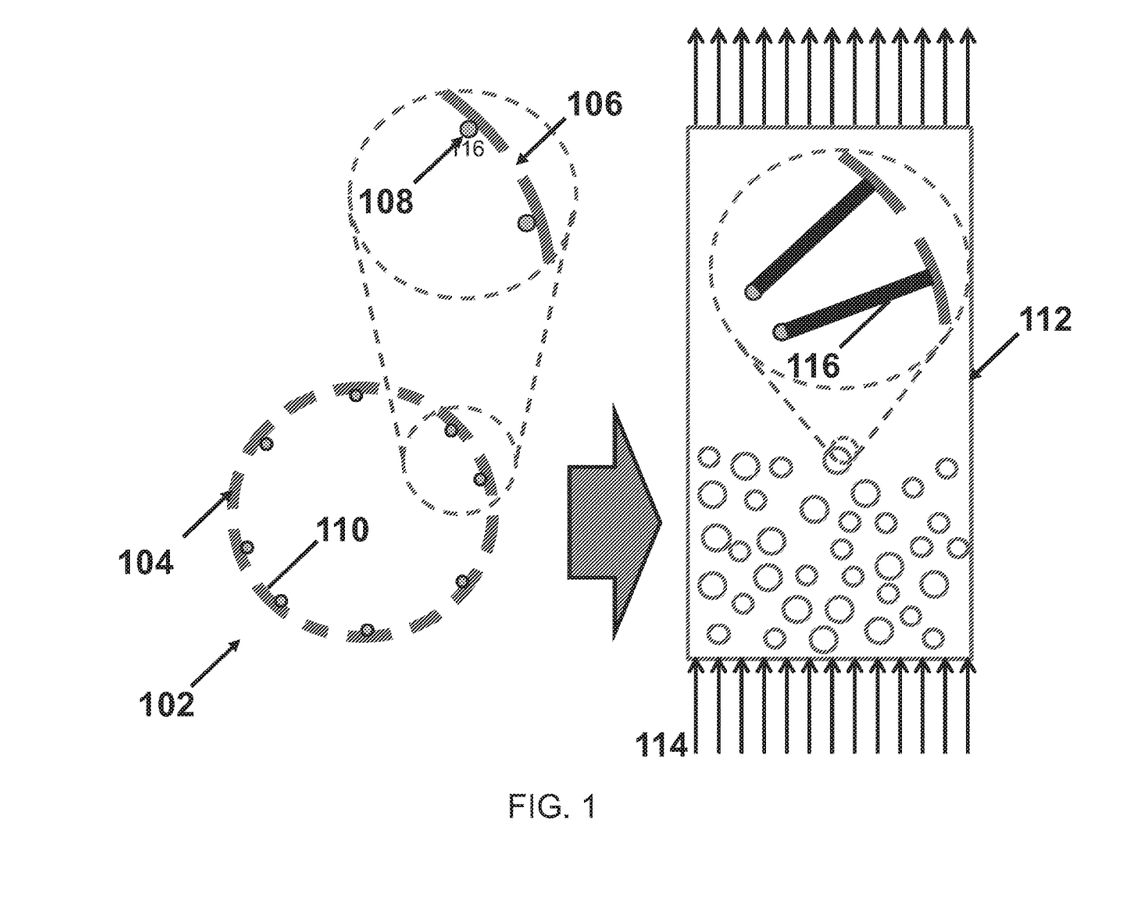
FIG. 1 provides an exemplary illustration of nanostructure synthesis according to one aspect of the disclosed technology.

FIG. 1 illustrates a versatile, scalable, and high fidelity manufacturing methodology to synthesize large quantities of monodisperse nanostructures.

As illustrated in FIG. 1, hollow shells 102 may serve as vehicles to grow nanostructures 116. The hollow shells 102 may have various configurations, with differences in shape, material, diameter, surface coating, porosity, mechanical strength and catalyst distribution. In one embodiment, each hollow shell may be in the form of a hollow microsphere.

Each hollow shell 102 may provide a large internal surface area or an interior surface 110 for nanostructure growth. Each hollow shell 102 may have a wall 104 with a plurality of pores 106 defined therein. The pores 106 may enable efficient mass and heat transport, which is critical for nanostructure growth and structural control. Nanoparticles 108 may decorate the interior surface 110 of the porous wall 104 of each hollow shell 102. The nanoparticles 108 may serve as catalysts for nanostructure growth. Each hollow shell 102 may prevent nanostructure agglomeration and precipitation and protect the nanostructures. Each hollow shell 102 may also protect catalyst nanoparticles 108 during processing.

To grow the nanostructures 116, the hollow shells 102 may be placed in a reactor 112. The reactor 112 may be a semi-batch or continuous flow reactor 112. In one example, the nanostructures 116 may remain in the reactor 112 during growth, and may not be removed from the reactor 112 until the growth completes. Precursors 114 may be introduced into the reactor 112. The nanostructures 116 may be synthesized on the interior surface 110 of the hollow shells 102, in a manner similar to forming crystallites inside a geode.

Figure 2:
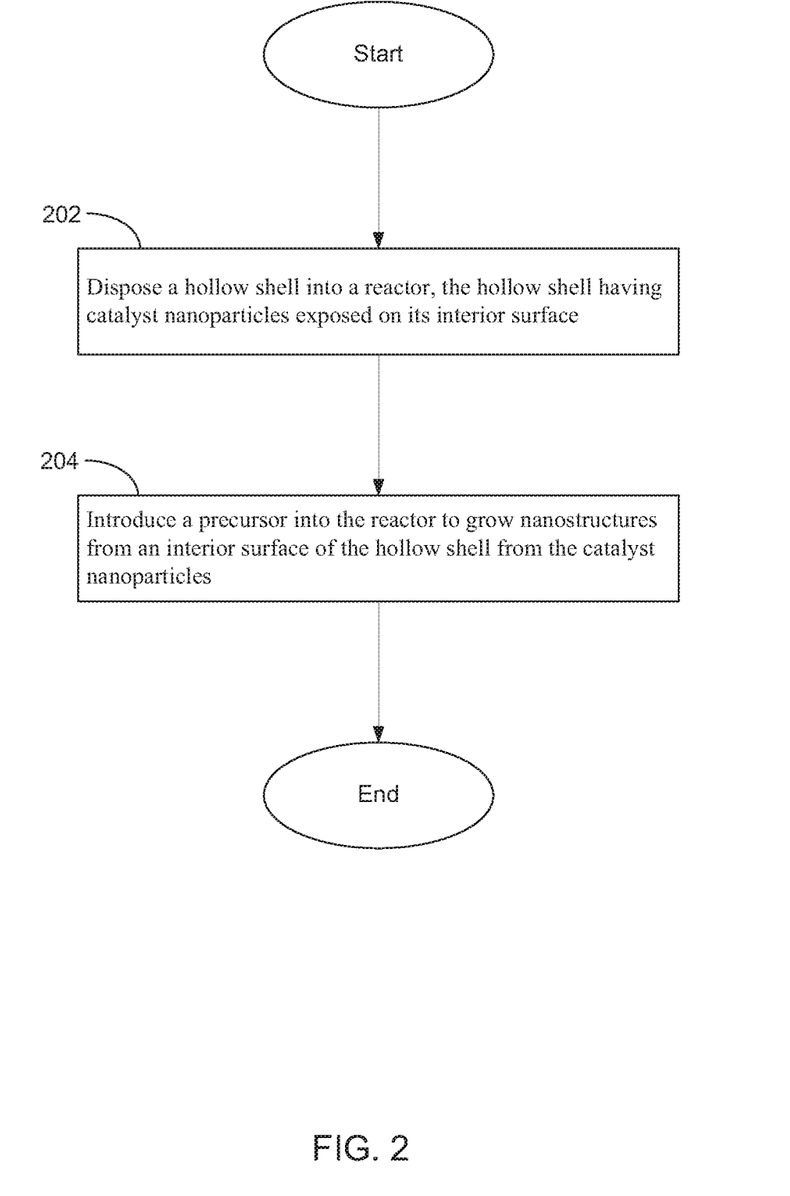
FIG. 2 provides a flow diagram of a method for growing nanostructures according to one aspect of the disclosed technology.

FIG. 2 provides a flow-diagram of a method for forming nanostructures, in accordance with an exemplary embodiment of the disclosed technology. In block 202, a hollow shell 102 may be introduced into a reactor 112. The hollow shell 102 may have one or more catalyst nanoparticles 108 exposed on its interior surface 110. In block 204, a precursor 114 may be introduced into the reactor 112 to grow one or more nanostructures 116 from an interior surface of the hollow shell 102 from the catalyst nanoparticles 108.

2. Growth of Nanostructures Via "Bottom-Up" Synthesis

Figure 3:
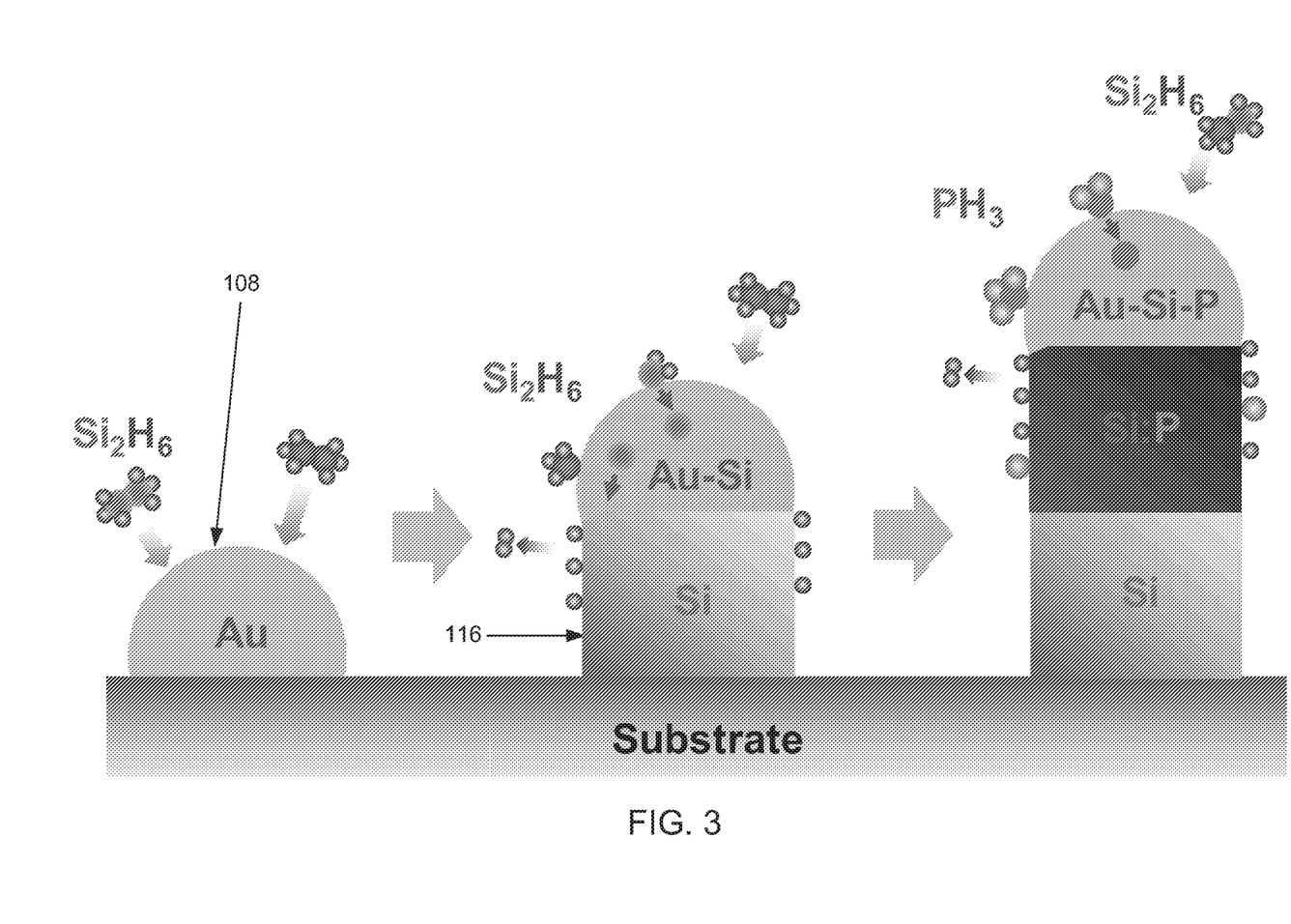
FIG. 3 illustrates an exemplary vapor-liquid-solid growth process according to one aspect of the disclosed technology.

In one aspect, the nanostructures 116 may grow from the interior surface 110 of the hollow shell 102 via "bottom-up" syntheses (e.g., vapor-liquid-solid (VLS)). FIG. 3 illustrates an exemplary VLS synthesis. As illustrated in FIG. 3, a catalyst nanoparticle 108 may collect semiconductor atoms delivered from impinging precursors. For example, Au catalyst nanoparticles and $SiH_4$ (or similar precursors) may be used to grow Si nanostructures. When the semiconductor atoms in the catalyst nanoparticle 108 surpass a critical supersaturation, a solid nanostructure 116 may precipitate from the catalyst nanoparticle 108.

3. Nanostructure

The disclosed method may control growth of each nanostructure 116, to a fine degree such as on an atomic- or nanometer-scale, so as to configure one or more physical attributes, chemical attributes, or other attributes of each nanostructure. The growth of each nanostructure 116 may be controlled by modifying the precursor during the growing process. For example, the disclosed method may configure or tune each nanostructure in terms of its diameter, length, morphology, crystal structure, composition and heterostructure, among many other possibilities.

In one embodiment, the disclosed method may produce a nanostructure of any shape, including, but not limited to, a rod-like shape such as a nanowire and a tube-like structure such as a nanotube, among many other possibilities.

In one embodiment, each nanostructure produced according to the disclosed method may have a diameter of approximately 10 to 500 nm. In a certain embodiment, each nanostructure may have a diameter of approximately 20 to 200 nm. In one embodiment, each nanostructure may have a length of approximately 0.5 to 100 μm.

In one embodiment, the disclosed method may produce nanostructures of any material, including, but not limited to group IV (e.g., Si, Ge, $Si_{1-x}Ge_x$), III-V (e.g., GaAs, InP), and II-VI (e.g., ZnSe, CdTe) materials, and one or more combinations thereof.

Each nanostructure produced according to the disclosed method may have a well-defined and precisely controlled structural and functional heterogeneity. For example, a nanostructure may include one or more functional blocks, where the function of each block may be dictated by the physical attributes, the chemical attributes, or other attributes of each bock. For example, the function of each block may be dictated by at least one of its diameter, length, morphology, crystal structure, composition and heterostructure, In one example, a nanostructure produced according to the disclosed method may include two or more different materials. In one nanostructure, different materials may be axially or radially displaced relative to each other. As illustrated in FIG. 3, the nanostructure 116 may be elongated by different blocks by adding different precursors. In one example, the co-flow of dopant precursors (e.g., $B_2H_6$ or $PH_3$) may provide control of carrier density. As illustrated in FIG. 3, conductivity may be modified via dopant atom (e.g., B or P) incorporation, either uniformly along the length or in well-defined axial positions.

In one aspect, nanostructures with different combinations of materials may be produced according to the disclosed method. In one example, nanostructures may include Si and Ge. In another example, nanostructures may include InP and GaAs.

The method disclosed herein may produce a wide array of complex nanostructures 116, which, in turn, may offer a vast array of unique and technologically useful properties. In one example, which is appropriate for thermoelectrics, silicon nanostructures may be fully doped p-type or n-type. In another example, nanostructures may contain p/n/p or n/p/n profiles that serve as the starting point of field effect transistors with which to build computational devices.

4. Reactor

The reactor 112 may be a semi-bath or continuous flow fluidized bed reactor, a packed bed reactor, or any conventional chemical vapor deposition (CVD) reactor.

In one embodiment, the reactor 112 is a fluidized bed reactor. In this embodiment, the reactor 112 may operate by levitating or "fluidizing" micron- to millimeter-sized particles in a reactant flow. Rapid mixing is inherent to fluidized beds and offers efficient mass/heat transport.

Figure 4:
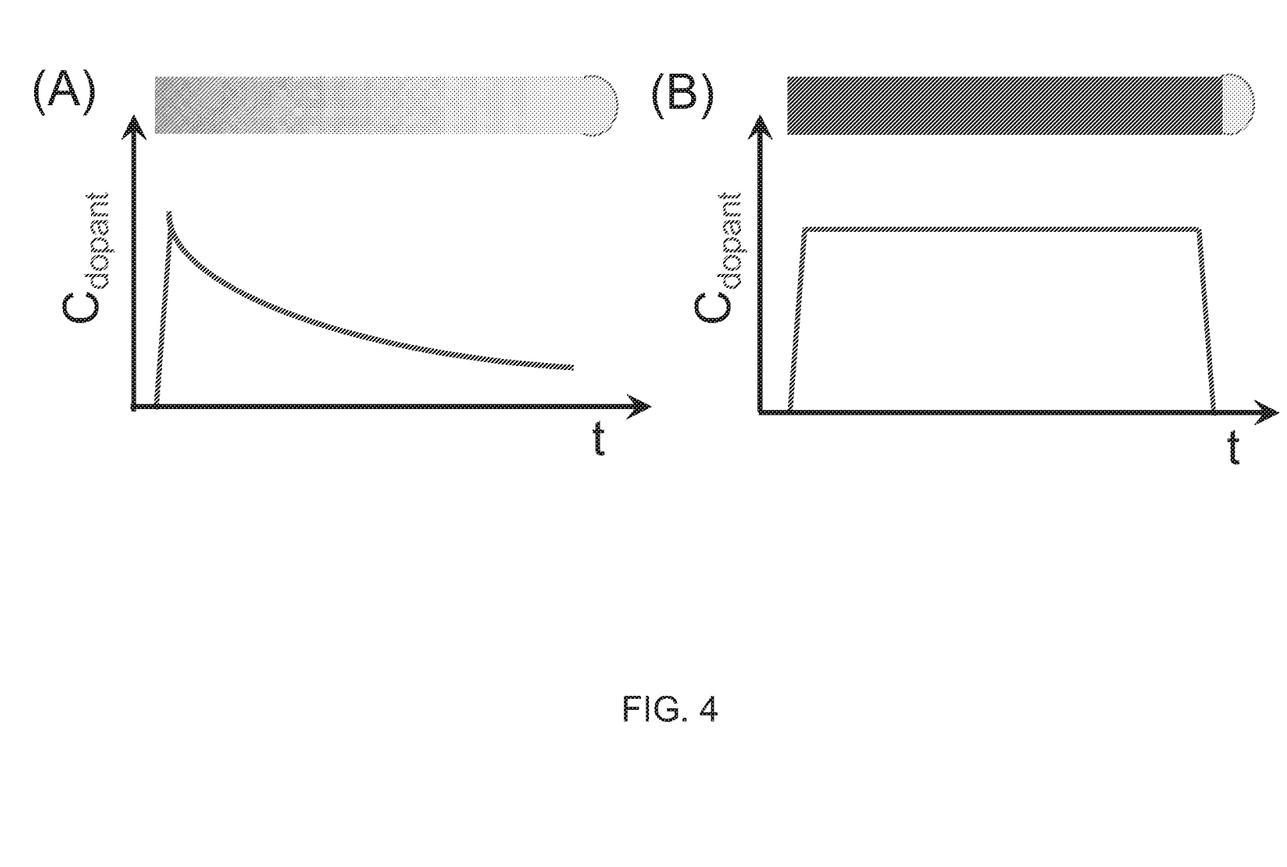
FIGS. 4A and 4B respectively illustrate dopant gas concentration ($C_{dopant}$) around a nanostructure and its catalyst nanoparticle and resulting nanostructure composition in a tubular reactor and a fluidized bed reactor.

Fluidized beds, as opposed to the tubular flow reactors, may offer facile control of nanostructure structure. FIGS. 4A and 4B respectively illustrate dopant gas concentration ($C_{dopant}$) around a nanostructure and its catalyst nanoparticle and resulting nanostructure composition in a tubular reactor and a fluidized bed reactor.

In particular, FIG. 4A illustrates that in the tubular reactor, the concentration of precursors, containing semiconductor (e.g., $SiH_4$) and/or dopant atoms (e.g., $PH_3$), injected at the tube entrance decays due to decomposition at the catalyst nanoparticle and incorporation into the growing nanostructure. In the case of dopants, the changing precursor concentration results in undesirable carrier density gradients. The changing precursor concentration also makes nanostructure growth, even without dopants, challenging to control.

By contrast, the fluidized bed reactor as shown in FIG. 4B maintains a high and consistent precursor or dopant gas concentration. Fluidized beds may decouple nanostructure residence (i.e., growth) time and precursor flow, which is critical for achieving a desired nanostructure structure. Nanostructures (on the interior surface of hollow shells) may be largely stationary with respect to reactor position (except for local shell mixing) while injected precursors flow by. As a result, as shown in FIG. 4B, the fluidized bed reactor may minimize variations in the precursor concentration and increase structural uniformity.

Figure 5:
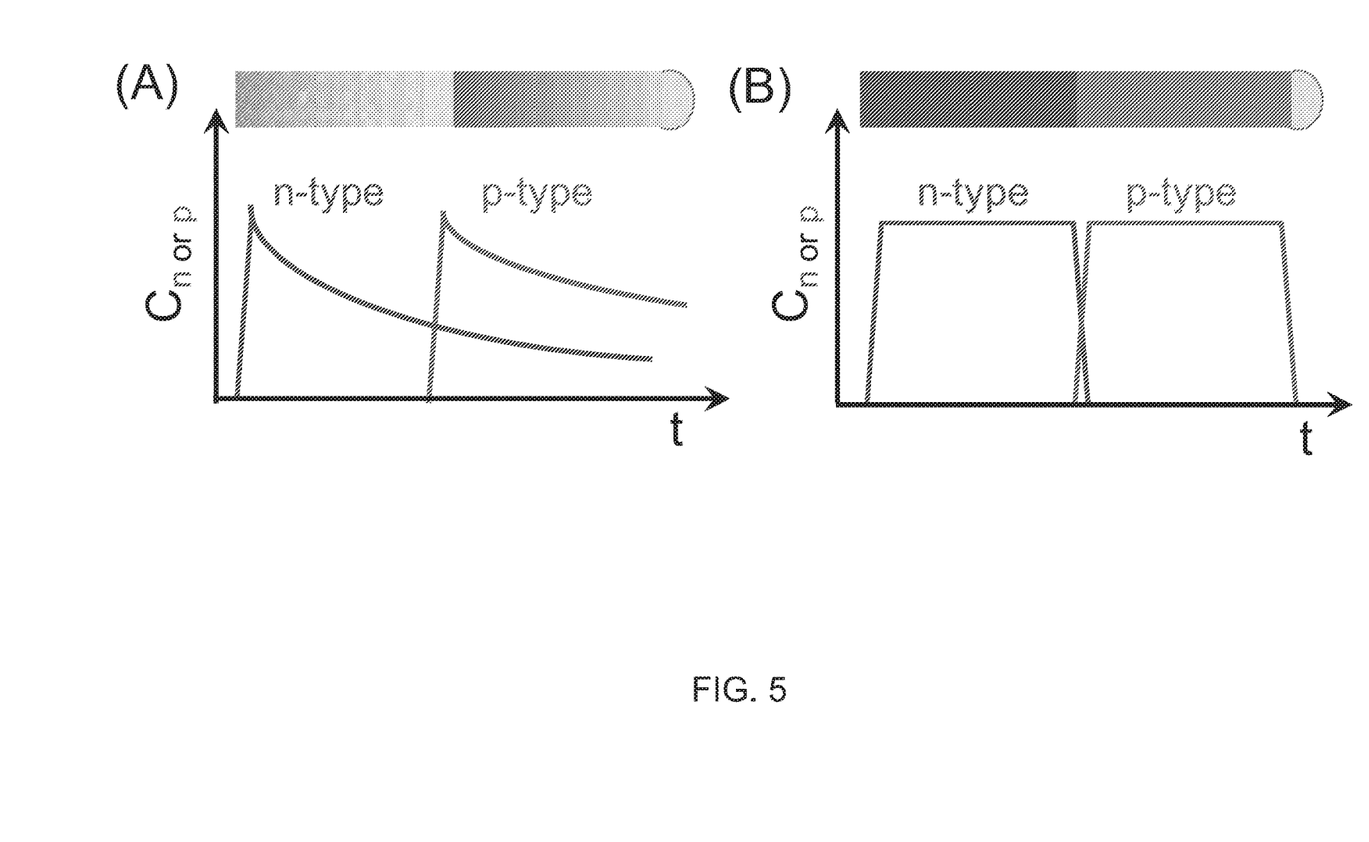
FIGS. 5A and 5B respectively illustrate n-type and p-type dopant gas concentration ($C_{n\ or\ p}$) around a nanostructure and its catalyst nanoparticle and resulting nanostructure composition in a tubular reactor and a fluidized bed reactor.

For purposes of growing different functional blocks of nanostructures, the fluidized bed reactor may enable easy switching between precursors partway through nanostructure growth. For instance, the fluidized bed reactor may promise far more abrupt transitions between functional blocks than their tubular counterparts. By way of example, to create a p/n junction in Si, the flow of $B_2H_6$ and $PH_3$ must be terminated and initiated, respectively. As shown in FIG. 5A, in a tubular reactor, the first dopant precursor remains in the reactor while the second precursor is added. Selective removal of the first precursor, while possible in principle, is an enormous technical challenge in the tubular reactor. FIG. 5B illustrates the situation in a fluidized bed. When switching between dopant precursors, the initial precursor is rapidly depleted in the bed, allowing a abrupt transition in composition to be achieved.

5. Precursor

The precursor 114 may be in the form of either gas, liquid or supercritical fluid. Gaseous precursors may circumvent the need for expensive, toxic, and difficult to dispose of solvents common to solution-based processing techniques. While condensed phase precursors may greatly reduce the rate of mass/heat transport, and may also complicate the formation of multiple functional blocks in individual nanostructures necessary for a range of device types, they may be appropriate in cases with slow growth kinetics. The precursor may include at least one of the following: $SiH_4$, $B_2H_6$ and $PH_3$. The precursor may refer to one or more precursors. In one embodiment, a plurality of precursors may be introduced into the reactor 112 at the same time. In another embodiment, the plurality of precursors may be introduced into the reactor 112 in a sequential order or at different points in time.

In one embodiment, a first precursor may be introduced into the reactor 112 to grow a nanostructure 116 by a first portion. A second precursor may be introduced into the reactor 112 to grow the nanostructure by a second portion. The first portion and the second portion may be axially or radially displaced relative to each other. The second precursor may be different from the first precursor. In an example, the first precursor may contain at least $SiH_4$ and $B_2H_6$, while the second precursor may contain at least $SiH_4$ and $PH_3$.

6. Catalyst Nanoparticles

The catalyst nanoparticles 108 may include, but are not limited to, any one of the following: gold (Au), tin (Sn) and copper (Cu). Catalyst nanoparticle 108 concentration during hollow shell synthesis may be used to tune the typical spacing between the catalyst nanoparticles, and therefore between the nanostructures 116 during their growth. The catalyst nanoparticles 108 may be in the form of liquid-metal catalyst droplets.

7. Hollow Shell

Figure 6:
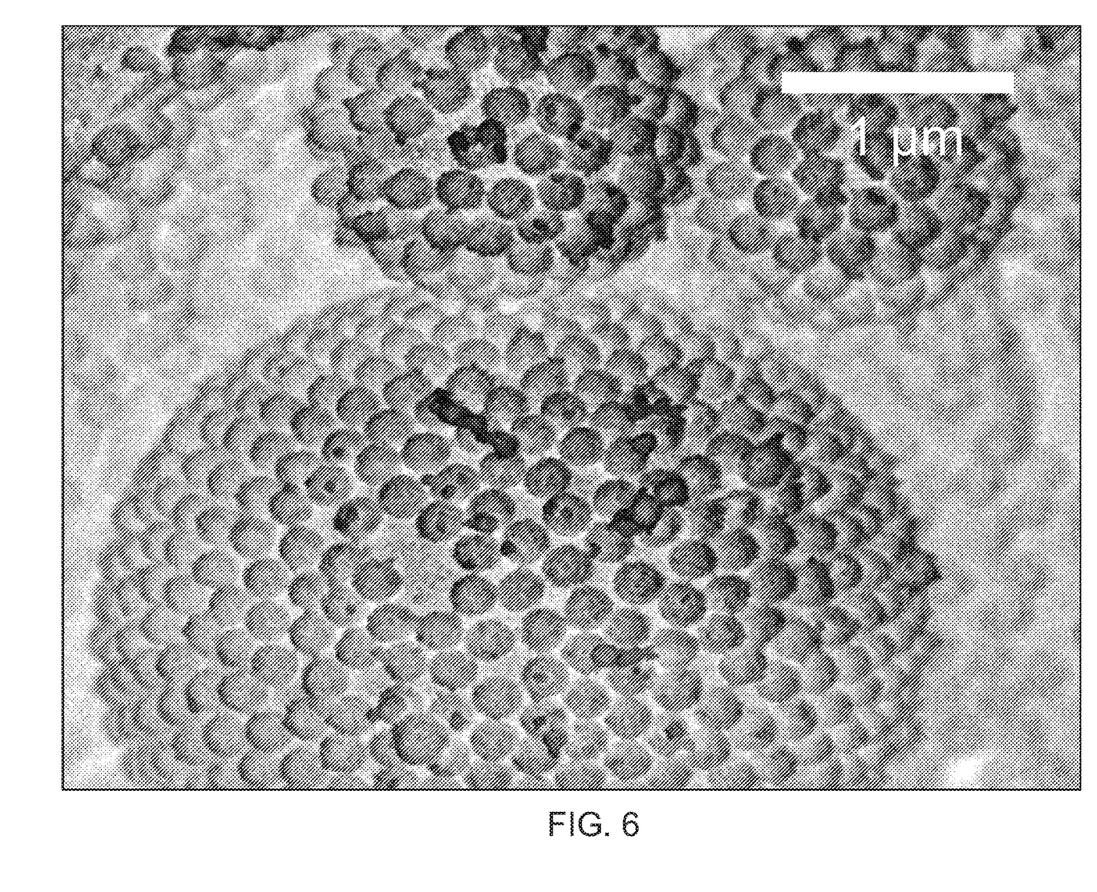
FIG. 6 illustrates exemplary particle-decorated droplets in a particle-stabilized emulsion.

Each hollow shell 102 may be synthesized in bulk quantities, or on a large scale, via emulsion templating. Emulsion templating may provide a facile method to fabricate large quantities of the hollow shells 102 decorated with the catalyst nanoparticles 108 needed for nanostructure growth. Emulsion templating may generate gram to kilogram quantities of hollow shells with appropriate sizes and mass transfer properties (i.e., controlled porosity) in which the nanostructures can be grown. FIG. 6 provides an example of particle-decorated droplets in a particle-stabilized emulsion.

In one embodiment, each hollow shell 102 may have a diameter of approximately 3 to 500 µm. In a certain embodiment, hollow shells 102 may have an average diameter of approximately 30 to 50 µm. In one embodiment, each hollow shell 102 may have a wall 104 with a thickness of approximately 0.02 to 2 µm. In one embodiment, each pore 106 defined on a hollow shell 102 may have a size of approximately 0.02 to 0.5 µm.

7.1 Single Emulsion

In one embodiment, to create a hollow shell 102, a droplet interface of a oil-in-water emulsion may be densely covered with a mixture of structural shell material and nanostructure growth catalyst nanoparticles. In one example, the structural shell material may be colloidal silica particles. An emulsion droplet may have a diameter in a range of approximately 3-500 µm to grow nanostructures having a length of approximately 0.5-100 µm. The resulting hollow composite shells may expose nanoparticles on their inner shell surface from which nanostructures can be grown.

Figure 7:
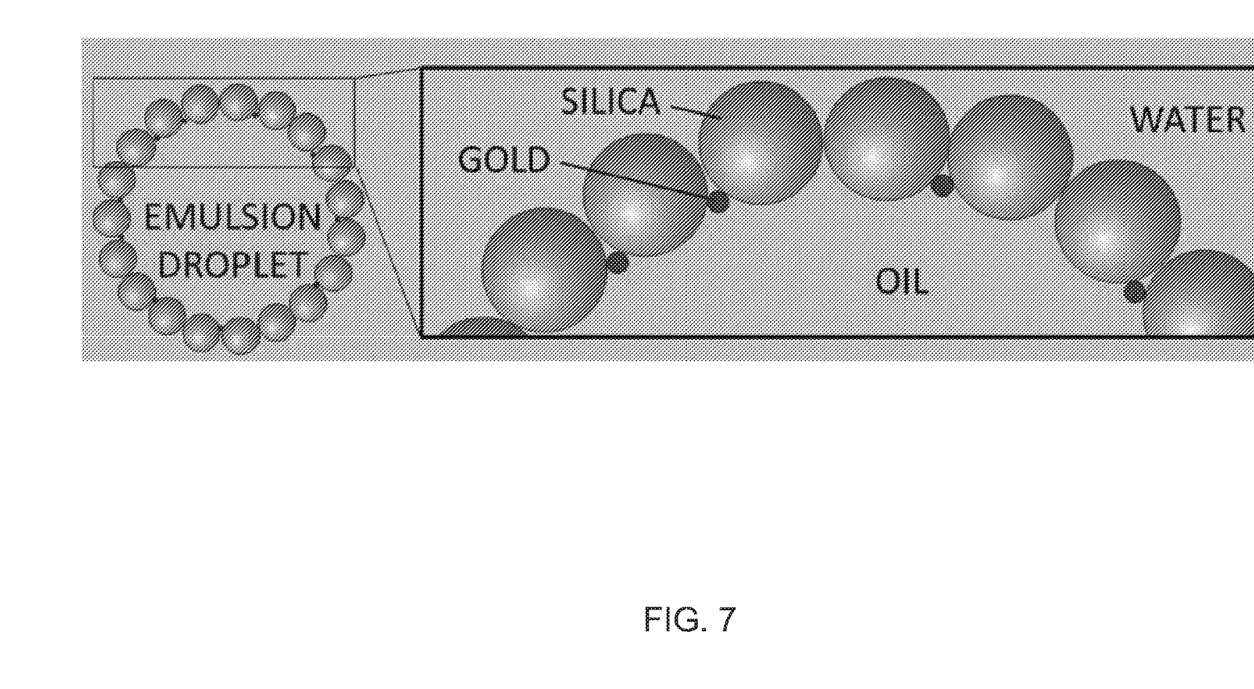
FIG. 7 provides a schematic of an exemplary emulsion droplet decorated with a mixture of gold catalyst nanoparticles and silica structural particles to be used for hollow shell fabrication according to one aspect of the disclosed technology.

FIG. 7 provides a schematic of an exemplary emulsion droplet decorated with a mixture of gold catalyst nanoparticles and silica particles to be used for hollow shell fabrication. As illustrated in FIG. 7, colloidal particles with somewhat similar affinity for both liquids in the emulsion may strongly adsorb to the liquid interface as a result of an interfacial energy benefit that typically exceeds the thermal energy by several orders of magnitude. As a result, particles may self-assemble in a dense layer around emulsion droplets, and connect, by virtue of their van der Waals attraction, into a solid capsule shell, which may be referred to as a "colloidosome," with interstitial pores of a size dictated by the particle size.

7.2 Double Emulsion

Figure 8:
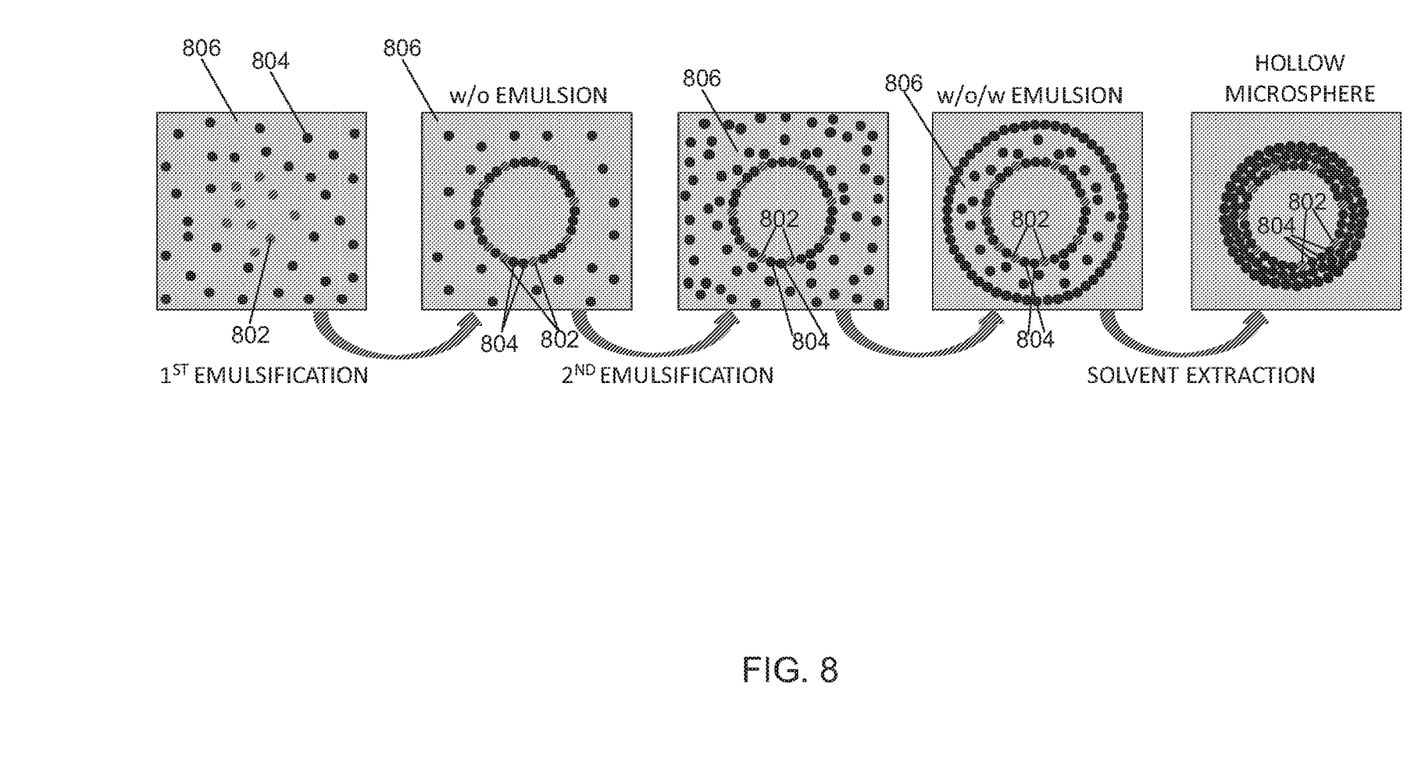
FIG. 8 provides an exemplary formation of multilayer hollow shells via double emulsification and solvent extraction according to one aspect of the disclosed technology.

The hollow shell may be consolidated and reinforced in a number of ways to improve its mechanical strength. In one embodiment, as illustrated in FIG. 8, a double emulsion/solvent extraction approach may be adopted to obtain multilayer hollow shells. As shown in FIG. 8, an aqueous dispersion of gold particles 802 is emulsified in a non-aqueous dispersion of (hydrophobically modified) silica 804. Both types of particles may adsorb at the liquid interface and stabilize the resulting water-in-oil (w/o) emulsion, which may be then re-emulsified in an aqueous dispersion of (hydrophilic) silica to form a water-in-oil-in-water (w/o/w) double emulsion. Extraction of the oil 806 phase from the resulting particle-stabilized w/o/w double emulsion yields multilayer hollow shells with the gold catalyst 802 present on the inner wall.

7.3 Joint Adsorption of Catalyst Nanoparticles and Support Particles

The interior surface 110 of each hollow shell 102 may expose dispersed catalyst nanoparticles 108. In one example, readily available silica and gold particles may not have the right wettability to adsorb at the surface of the templating emulsion droplets simultaneously under the same solution conditions. The wettability may be tuned independently for both particle types using standard surface modification techniques (e.g., silane-based for silica, thiol-based for gold) to ensure that both particle types adsorb jointly. Surface modification may be used, along with the pH and salt concentration of the aqueous medium, to tune the electrostatic particle interaction. A sufficiently strong inter-particle repulsion may be achieved to inhibit particle aggregation in the aqueous bulk prior to adsorption at the droplet surface, yet not so strong as to prevent the formation of a dense adsorbate layer. By ensuring a more repulsive electrostatic pair interaction between catalyst nanoparticles than between catalyst nanoparticles and support particles, it is possible to keep the catalyst nanoparticles well separated within the shell wall.

7.4 Hollow Shell Mechanical Strength

Each hollow shell 102 may have sufficient mechanical stability to survive subsequent processing (e.g., spray drying) and reactor conditions. In one example, the hollow shells 102 must withstand the stresses imposed upon them during drying and sintering, as well as during nanostructure synthesis in the fluidized bed. Returning to FIGS. 7-8, the double emulsion/solvent extraction approach illustrated in FIG. 8 may provide higher mechanical strength than the approach illustrated in FIG. 7.

In some embodiments, should further mechanical strength be required, particle bridging by adsorbing polyelectrolytes of opposite charge, interfacial polymerization, additional silica deposition on the shell via sol-gel processes, or particle sintering may also be implemented.

7.5 Wall Porosity of Hollow Shell

In some embodiments, porosity of the hollow shells may be kept high enough to guarantee fast precursor mass transfer between the catalyst nanoparticles on the shell interior and bulk fluid on the shell exterior.

In one embodiment, the hollow shells 102 may have sufficiently high porosity to reduce, and preferably eliminate, mass transfer limitations for precursors and reaction products during nanostructure growth. The permeability of each hollow shell may be primarily determined by the interstitial spaces between the colloidal particles in the shell and can thus be controlled via the particle size. Some of the measures to increase strength may, however, reduce the porosity to some extent. Often such reinforced shells may still retain a high porosity, especially for gas transport, but may be robust enough to withstand the large capillary stresses associated with transfer into a different liquid phase, drying, or other processing steps. To obtain additional large pores, some readily degradable particles may be incorporated in the shell wall. For example, capsule pores may be opened in aqueous media via triggered dissolution of pH-responsive polymer particles embedded in the shell wall.

7.6 Hollow Shell Drying and Formation of Powders

In some embodiments, the hollow shells prepared via emulsion templating may be transferred from the liquid system in which they were assembled to a dry powder state. Spray drying may produce quantities up to several kilograms of hollow shell powders in the particle size range of approximately 3 to 500 microns. In one embodiment, dried hollow shells may be found resilient against mechanical forces that occur during further processing, including nanostructure growth, and the catalyst nanoparticles may be well dispersed along the interior wall of each hollow shell.

8. Nanostructure Harvesting

Once the nanostructures are synthesized, the nanostructures may be subsequently harvested and processed. For example, the nanostructures may be subsequently processed into a thermoelectric module or system.

As-grown nanostructures may be harvested by a variety of different mechanisms (e.g., selective etching, mechanical agitation and dissolution). For example, selective etching of the silica shells, to release Si nanostructures, may be accomplished with HF. To stabilize nanostructures against van der Waals force-induced aggregation, the nanostructure surface may be functionalized prior to removing the shell.

9. Summary

The disclosed technology provides a versatile approach to produce monodisperse, functional nanostructures at scale. When compared to nanostructure synthesis on a 2-D substrate at the same growth rate and areal density, the disclosed 3-D technology described herein may easily achieve productivity enhancements over 1000×.

The high-grade nanostructures manufactured according to the disclosed technology may be adapted to a range of high-tech applications, including, but not limited to: automotive thermoelectric systems, large-area electronics, solid-state lighting, solar energy harvesting, bioelectronics, and optical coatings, among other possibilities.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended. The term "exemplary" used herein does not mean best mode, but rather, example.

Accordingly, those skilled in the art will appreciate that the conception upon which the application and claims are based may be readily utilized as a basis for the design of other structures, methods, and systems for carrying out the several purposes of the embodiments and claims disclosed in this application. It is important, therefore, that the claims be regarded as including such equivalent constructions.

Furthermore, the purpose of the foregoing Abstract is to enable the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

The invention claimed is:

1. A method for forming nanostructures comprising:
   synthesizing a hollow shell via emulsion templating, where a wall of the hollow shell includes a plurality of first particles, an interior surface of the wall includes a plurality of second particles exposed thereon, and the second particles are catalyst particles;
   introducing the hollow shell into a reactor; and
   introducing a precursor into the reactor to grow nanostructures inside the hollow shell from the catalyst particles.

2. The method of claim 1, wherein the reactor comprises a fluidized bed.

3. The method of claim 1, wherein the reactor comprises a packed bed.

4. The method of claim 1, wherein the precursor is gaseous.

5. A method for forming nanostructures comprising:
   synthesizing a hollow shell via emulsion templating, where a wall of the hollow shell includes a plurality of first particles, an interior surface of the wall includes a plurality of second particles exposed thereon, and the second particles are catalyst particles;
   introducing the hollow shell into a reactor; and
   introducing a precursor into the reactor to grow nanostructures inside the hollow shell from the catalyst particles;
   wherein the precursor includes at least one of the following: $SiH_4$, $B_2H_6$ and $PH_3$; and wherein the nanostructures include at least one of the following materials: group IV, III-V and II-VI semiconductors.

6. The method of claim 1, wherein at least a portion of the catalyst particles contain metal.

7. The method of claim 1, wherein at least a portion of the catalyst particles comprise at least one of the following elements: gold, tin and copper.

8. The method of claim 1, wherein the nanostructures include at least one of the following materials: group IV, III-V and II-VI semiconductors.

9. The method of claim 1, wherein the nanostructures have at least one of the following configurations: nanowire and nanotube.

10. The method of claim 1, wherein at least a portion of the nanostructures have a diameter of approximately 10 to 500 nm.

11. The method of claim 1, wherein at least a portion of the nanostructures have a diameter of approximately 20 to 200 nm.

12. The method of claim 1, wherein at least a portion of the nanostructures have a length of approximately 0.5 to 100 µm.

13. The method of claim 1 further comprising harvesting the nanostructures from the inside of the hollow shell.

14. The method of claim 1, wherein introducing the precursor comprises introducing a plurality of precursors into the reactor.

15. The method of claim 14, wherein at least a portion of the plurality of precursors are introduced into the reactor at the same time.

16. The method of claim 14, wherein at least two of the plurality of precursors are introduced into the reactor at different points in time.

17. The method of claim 1, wherein introducing the precursor comprises:
    introducing a first precursor to grow at least a portion of the nanostructures by a first portion; and
    introducing a second precursor to grow at least a portion of the nanostructures by a second portion, the second precursor being different from the first precursor.

18. The method of claim 17, wherein the first precursor contains at least $SiH_4$ and $B_2H_6$, and the second precursor contains at least $SiH_4$ and $PH_3$.

19. The method of claim 1, wherein the wall of the hollow shell defines one or more pores.

20. The method of claim 19, wherein at least a portion of the pores define a size of approximately 0.02 to 0.5 µm.

21. The method of claim 1, wherein the first particles comprise silica particles.

22. The method of claim 1, wherein the hollow shell meets at least one of the following conditions: a diameter of approximately 3 to 500 µm and a wall with a thickness of approximately 0.02 to 2 µm.

23. The method of claim 1 further comprising drying the hollow shell.

24. A method for forming nanostructures comprising:
    synthesizing a hollow shell via emulsion templating by:
        emulsifying a first dispersion of first particles in a second dispersion of second particles to form a first emulsion, where the first particles are catalyst particles;
        re-emulsifying the first emulsion to form a double emulsion; and
        generating the hollow shell based on the double emulsion, where the catalyst particles are exposed on an interior surface of the hollow hell;
    introducing the hollow shell into a reactor; and
    introducing a precursor into the reactor to grow nanostructures inside the hollow shell from the catalyst particles.

25. The method of claim 24 further comprising drying the hollow shell.

26. The method of claim 24, wherein the second particles are silica particles.

27. The method of claim 24, wherein the first dispersion is an aqueous dispersion.

28. The method of claim 24, wherein the second dispersion is a non-aqueous dispersion.

29. The method of claim 24, wherein a continuous phase of the double emulsion is an aqueous dispersion.

30. The method of claim 24, wherein the first emulsion is a water-in-oil emulsion.

31. The method of claim 24, wherein the double emulsion is a water-in-oil-in-water double emulsion.

32. The method of claim 24 further comprising extracting a middle phase from the double emulsion to generate the hollow shell.

33. A method for forming nanostructures comprising:
    synthesizing a hollow shell via emulsion templating by:
        emulsifying a first dispersion of first particles in a second dispersion of second particles to form a first emulsion, where the first particles are catalyst particles;
        re-emulsifying the first emulsion to form a double emulsion; and
        extracting a middle phase from the double emulsion to generate the hollow shell, where the catalyst particles are exposed on an interior surface of the hollow shell;
    introducing the hollow shell into a reactor; and
    introducing a precursor into the reactor to grow nanostructures inside the hollow shell from the catalyst particles.

34. The method of claim 13 further comprising drying the hollow shell.

35. The method of claim 13, wherein the second particles are silica particles.

36. The method of claim 13, wherein the first dispersion is an aqueous dispersion.

37. The method of claim 13, wherein the second dispersion is a non-aqueous dispersion.

38. The method of claim 13, wherein a continuous phase of the double emulsion is an aqueous dispersion.

39. The method of claim 13, wherein the first emulsion is a water-in-oil emulsion.

40. The method of claim 13, wherein the double emulsion is a water-in-oil-in-water double emulsion.

* * * * *